(12) United States Patent
Bhatheja et al.

(10) Patent No.: US 11,418,188 B1
(45) Date of Patent: Aug. 16, 2022

(54) BOOTSTRAPPED SWITCH

(71) Applicant: NXP B.V., Eindhoven (NL)

(72) Inventors: Kushagra Bhatheja, Ames, IA (US);
Chris C. Dao, Pflugerville, TX (US);
Xiankun Jin, Austin, TX (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/317,592

(22) Filed: May 11, 2021

(51) Int. Cl.
*H03K 17/687* (2006.01)
*H03M 1/12* (2006.01)
*H03K 19/20* (2006.01)
*H03K 5/00* (2006.01)

(52) U.S. Cl.
CPC ......... *H03K 17/6872* (2013.01); *H03K 19/20* (2013.01); *H03M 1/12* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 3,942,039 A | 3/1976 | Kikuchi et al. | |
| 4,518,880 A * | 5/1985 | Masuda | H03K 19/00384 327/437 |
| 2007/0194832 A1* | 8/2007 | Miske | H03K 17/102 327/427 |

OTHER PUBLICATIONS

Razavi, Behzad, "A Circuit for All Seasons: The Bootstrapped Switch," IEEE Solid-State Circuits Magazine, Summer 2015, 4 pages.
Abo et al., "A 1.5-V, 10-bit, 14.3-MS/s CMOS Pipeline Analog-to-Digital Converter," IEEE Journal of Solid-State Circuits, vol. 34, No. 5, May 1999, 8 pages.
Steensgaard, Jesper, "Bootstrapped Low-Voltage Analog Switches," 1999 IEEE International Symposium on Circuits and Systems (ISCAS), May 30-Jun. 2, 1999, 4 pages.

* cited by examiner

*Primary Examiner* — Daniel C Puentes

(57) ABSTRACT

In an integrated circuit, a bootstrapped switch includes a capacitor and first, second, and third transistors. The first transistor has a first current electrode coupled to a first voltage supply node and a gate electrode coupled to a first circuit node. The second transistor has a first current electrode coupled to a second voltage supply terminal, a second current electrode coupled to a top terminal of the capacitor, and a control electrode coupled to the first circuit node. The third transistor has a first current electrode coupled to the first voltage supply terminal, a control electrode coupled to the first circuit node, and a second current electrode coupled to a body terminal of the second transistor. The fourth transistor has a first current electrode coupled to the body terminal of the second transistor, and a second current electrode coupled to the top terminal of the capacitor.

20 Claims, 2 Drawing Sheets

BOOTSTRAPPED SWITCH

BACKGROUND

Field

This disclosure relates generally to integrated circuit devices, and more specifically, to a bootstrapped switch.

Related Art

Field-effect transistors (FETs) have been used as switches, particularly for analog signals, for many years. It has been discovered that such devices can exhibit an input-dependent on-resistance, thereby introducing distortion, particularly when used with analog signals. This issue can be resolved using a bootstrapped switch that minimizes the on-resistance variation in the presence of large input and output voltage swings.

Reliability of a bootstrapped switch requires source/drain-bulk junctions not to be forward biased during the functioning of the circuit. During switch-off transition, the drain-bulk junction of a transistor connecting voltage supply to a capacitor in the bootstrapped switch can become forward biased due to voltage at the capacitor falling below supply. When a transistor is forward-biased, transistor leakage increases, thereby consuming more power than necessary. To provide energy efficient devices, it is desirable to provide a bootstrapped switch that avoids problems caused by forward bias.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of integrated circuits disclosed herein provide a bootstrapped switch with dynamic bulk biasing to prevent a source-bulk junction of a transistor connecting supply voltage to a capacitor from becoming forward biased. In addition, an internal delay line that is already present with the bootstrapped switch can be used to provide non-overlapping signals to control operation of the bootstrapped switch and other external circuitry that might require non-overlapping controls. The delay line circuit provides a simple, cost effective solution that reuses existing circuitry and avoids the need for separate non-overlapping signal generation circuitry for each bootstrapped switch.

Figures 1, 2:
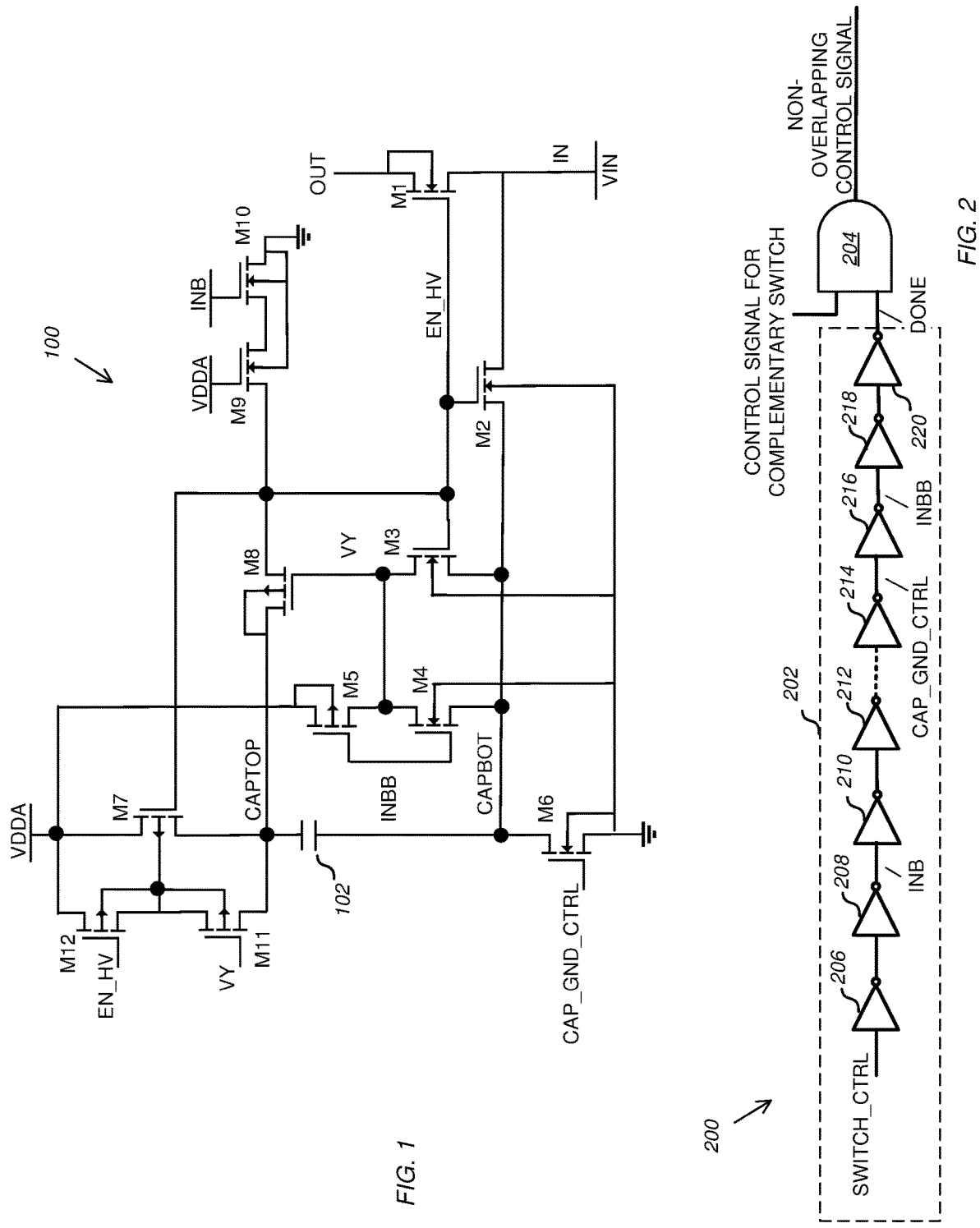
FIG. 1 illustrates a schematic diagram of a bootstrapped switch in accordance with selected embodiments of the present invention.
FIG. 2 illustrates a schematic diagram of a delay circuit that may be used with the bootstrapped switch of FIG. 1 in accordance with selected embodiments of the invention.

FIG. 1 illustrates a schematic diagram of bootstrapped switch 100 in accordance with selected embodiments of the present invention that can include PMOS transistors M5, M7, M8, M11, and M12, NMOS transistors M1, M2, M3, M4, M6, M9 and M10, and capacitor 102.

PMOS transistor M7 includes a source electrode coupled to supply voltage VDDA, a drain electrode coupled to a top terminal of capacitor 102, and a gate electrode coupled to drain electrodes of PMOS transistor M8 and NMOS transistor M9, and to gate electrodes of NMOS transistors M1, M2 and M3. Note that the term "gate electrode" is also referred to as "control electrode" herein. In addition, the term "electrode" is also used interchangeably with "terminal".

PMOS transistor M8 further includes a source electrode coupled to the top terminal of capacitor 102 and a gate electrode coupled to a drain electrode of NMOS transistor M3.

NMOS transistor M9 further includes a gate electrode coupled to supply voltage VDDA and a source electrode coupled to a drain electrode of NMOS transistor M10.

NMOS transistor M10 further includes a gate electrode coupled to signal INB and a source electrode coupled to ground. The generation of delayed input signal INB is further described in connection with delay line circuit 200 of FIG. 2.

PMOS transistor M11 includes a source electrode coupled to a drain electrode and PMOS transistor M12, a drain electrode coupled to the top terminal of capacitor 102, a bulk terminal coupled to a bulk terminal of PMOS transistor M7, and a gate electrode coupled to node VY.

PMOS transistor M12 includes a source electrode coupled to supply voltage VDDA, a drain electrode coupled to the source electrode of PMOS transistor M11, a bulk terminal coupled to a bulk terminal of PMOS transistor M7, and a gate electrode coupled to node EN_HV PMOS transistor M5 and NMOS transistor M4 form an inverter with a source electrode of PMOS transistor M5 coupled to supply voltage VDDA, a drain electrode coupled to a drain electrode of NMOS transistor M4 and gate electrodes of transistors M5 and M4 coupled to signal INBB. The generation of delayed input signal INBB is further described in connection with delay line circuit 200 of FIG. 2. NMOS transistor M4 further includes a source electrode coupled to the bottom terminal of capacitor 102 at node CAPBOT. The bulk terminal of NMOS transistors M4 is coupled to ground.

NMOS transistor M6 includes a drain electrode coupled to the bottom terminal of capacitor 102 at node CAPBOT, a source electrode coupled to ground, and a gate electrode coupled to a capacitor ground control signal CAP_GND_CTRL. The generation of capacitor ground control signal CAP_GND_CTRL is further described in connection with delay line circuit 200 of FIG. 2.

NMOS transistor M3 includes a drain electrode coupled to the gate electrode of PMOS transistor M8, a source electrode coupled to the bottom terminal of capacitor 102 at node CAPBOT and a gate electrode coupled to drain electrodes of PMOS transistor M8 and NMOS transistor M9, and to gate electrodes of NMOS transistors M1, M2 at node EN_HV. The bulk terminal of NMOS transistors M3 is coupled to ground.

NMOS transistor M2 includes a source electrode coupled to the bottom terminal of capacitor 102 at node CAPBOT, a drain electrode coupled to supply voltage VIN, a gate electrode coupled to drain electrodes of PMOS transistor M8 and NMOS transistor M9 and to gate electrodes of NMOS transistors M1 and M3 at node EN_HV. A bulk terminal of NMOS transistor M2 is coupled to ground.

Before going into the details of operation of bootstrapped switch 100, the features of delay circuit 200 will be described to explain how control signals for bootstrapped switch 100 are generated. FIG. 2 illustrates a schematic diagram of delay circuit 200 that may be used with bootstrapped switch 100 of FIG. 1 in accordance with selected embodiments of the invention. In the embodiment shown, delay circuit 200 includes inverter circuit 202 that includes a series of inverters 206, 208, 210, 212, 214, 216, 218, 220 with output of the last inverter 220 coupled to an input of logic AND gate 204. The input to a first inverter 206 receives a switch control signal SWITCH_CTRL that propagates through the series of inverters 206-220, forming a set of control signals INB, CAP_GND_CTRL, and INBB. control signal for a complementary switch for bootstrapped switch 100 is coupled to a second input to AND gate 204. Signal INB is output by inverter 208 and is thus delayed from the input to inverter 206 by inversion operations of inverters 206 and 208. Signal CAP_GND_CTRL is output by inverter 214 and is thus delayed from the input to inverter 206 by inversion operations of inverters 206-214. Signal INBB is output by inverter 216 and is delayed from the input of inverter 206 by inversion operations of inverters 206-216. A final signal DONE is output by inverter 220 and provided to an input of AND gate 204. When both the control signal for the complementary switch and the DONE signals are at logic "1", the output of AND gate is at logic "1".

The output of AND gate 204 can be used to drive a complementary switch that can be switched on only when the bootstrap switch is OFF in an analog to digital converter (ADC), for example, as further described in connection with FIG. 3. However, the result also can be used in any application where matching of switches is important, e.g., matching the on-resistance of bootstrapped switch 100 with a complementary switch. Note that although delay circuit 200 has been shown with inverters 206-216, any suitable element, device, or combination of devices, can be used to provide the required amount of delay between signals.

During operation of bootstrapped switch 100, control signals INB, CAP_GND_CTRL, and INBB typically do not overlap one another. Delay circuit 202 can be configured such that the DONE signal reaches a logic "1" when voltage "EN_HV" has reached a "0" (switch M1 is off). AND gate 204 helps ensure that the control signal for a non-bootstrapped switch that output by AND gate 204 can turn on only when signal EN_HV is at logic "0". When a particular application requires, the short delay through AND gate 204 helps ensure that a non-bootstrapped switch turns OFF before bootstrapped switch 100 can turn ON.

Note that delay circuit 202 includes an even number of inverters 206-220 for the logic to work as intended. The number of inverters 206-220 that are included in delay circuit 202 can depend on the frequency at which bootstrapped switch 100 operates.

Referring to FIGS. 1 and 2, during operation when bootstrapped switch 100 is OFF, the signal SWITCH_CTRL is set HIGH, signal INB is at logic "1" to turn on transistor M10. The INBB signal is LOW, causing voltage at node VY to be HIGH, turning off transistor M8. With transistor M10 ON and transistor M8 OFF, voltage at node EN_HV is forced to ground. The bottom terminal of capacitor 102 is at ground because the CAP_GND_CTRL signal is HIGH, transistor M7 is ON, and the top terminal of capacitor 102 is charged to VDDA. Transistors M1, M2 and M3 are turned OFF.

To turn bootstrapped switch 100 on, the SWITCH_CTRL signal is set LOW, causing signal INB to go LOW. The CAP_GND_CTRL signal goes LOW at a later time in delay circuit 200. When signal INB goes LOW, transistor M10 is off and the gate terminal of transistor M1 becomes HIGH impedance. Then, CAP_GND_CTRL goes LOW, causing the bottom terminal of capacitor 102 to float near ground. After that, signal INBB goes HIGH, causing transistor M4 to turn ON, connecting the gate electrode of transistor M8 toward voltage at node CAPBOT. This results in transistor M8 turning ON and the charge stored on capacitor 102 starts flowing toward the gate terminal of transistor M1 as voltage at node EN_HV rises. While the gate voltage of transistor M1 rises, transistor M2 turns on and forces voltage at the bottom terminal of capacitor 102 (node CAPBOT) towards the input voltage VIN, which pushes the top terminal of capacitor 102 (node CAPTOP) to voltage VDDA+VIN. Eventually this voltage at node CAPTOP appears at the gate of transistor M1 and as a result transistor M1 turns on completely to connect the input terminal IN to the output terminal OUT. Transistor M2 turns on completely to connect input terminal IN to the bottom terminal of capacitor 102. Transistor M3 turns on completely to drive the gate of transistor M8 to the input voltage VIN level.

Transistor M3 can complement transistor M4, for example, when transistor M4 is turned OFF, the bottom terminal of capacitor 102 is connected to input terminal IN and VIN is higher than the gate voltage minus the threshold voltage of transistor M3. The gate-to-source voltages of transistors M1, M2, M3 and M8 are all equal to VDDA. Voltage at node CAPTOP can be ideally at VDDA+VIN. However, due to charge sharing, some of the charge on cap 102 can be distributed to parasitic capacitances on transistors M7, M2 and M1, causing a slight voltage drop on voltage at node CAPTOP. This voltage drop (deltaV) is directly proportional to the sizes of transistors M7, M2 and M1. Voltage at node CAPTOP is at VDDA+VIN-deltaV.

A bulk terminal of transistor M7 can be connected to bulk terminals of transistors M11 and M12 and between a drain electrode of transistor M12 and a source terminal of transistor M11. When bootstrapped switch 100 is turned OFF, voltage at node CAPBOT is pulled to ground, and voltage at node CAPTOP is at VDDA-deltaV. If the bulk of transistor M7 is connected to the CAPTOP node, then the bulk-source junction of transistor M7 becomes forward-biased, thereby increasing leakage of transistor M7. Transistors M11 and M12 help prevent transistor M7's bulk-drain junction from being forward biased.

In a first static condition, when bootstrapped switch 100 is turned OFF, voltage aqt node EN_HV is zero and voltages nodes VY and CAPTOP are equal to VDDA. Transistor 11 is OFF and transistor 12 is ON, so the bulk of transistor M7 is connected to VDDA. In a second static condition, when bootstrapped switch 100 is turned ON, voltage at node EN_HV is VDDA+VIN-deltaV, transistor M12 is OFF, and voltage at node VY is at VIN and CAPTOP is at VDDA+VIN-deltaV. Transistor M11 is ON, so the bulk of transistor M7 is connected to the voltage at node CAPTOP.

During a switch off transient condition, voltage at node EN_HV goes LOW, transistor M12 is ON, and voltage VY moves closer to VDDA. Accordingly, transistor M11 is turning OFF and during this transient, control passes to transistor M12. As voltage at node EN_HV goes LOW, the bulk of transistor M7 is connected to VDDA through transistor M12 instead of being forward biased.

Figure 3:
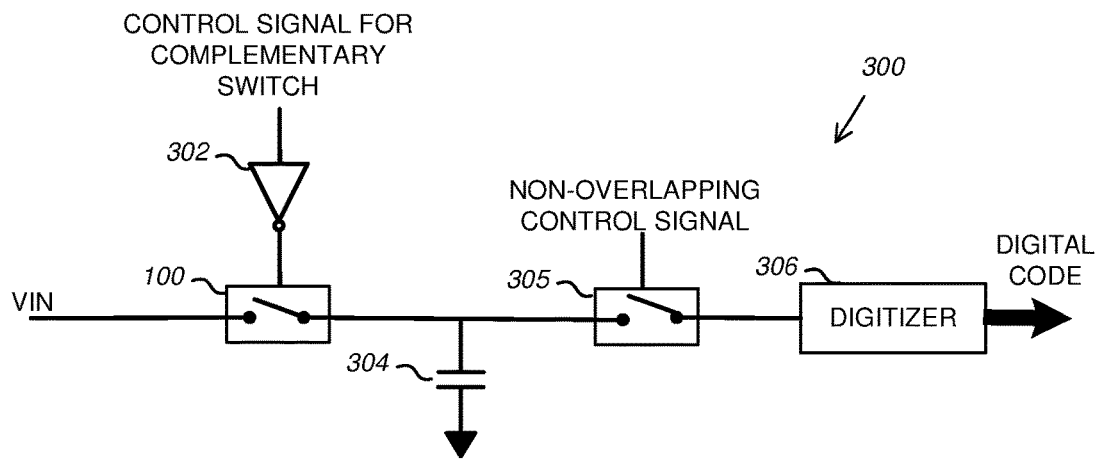
FIG. 3 is a schematic view of an analog to digital converter (ADC) that uses the bootstrapped switch of FIG. 1 in accordance with selected embodiments of the invention.

Referring to FIGS. 2 and 3, FIG. 3 is a schematic view of analog to digital converter (ADC) 300 that uses bootstrapped switch 100 of FIG. 1 in accordance with selected embodiments of the invention. ADC 300 converts a continuous time (analog) voltage to a digital code with a set of bits representing a data word that corresponds to the same data as the analog voltage.

ADC 300 includes bootstrapped switch 100 with a first terminal or current electrode that receives analog input voltage VIN along with a control input from inverter 302. An input to inverter 302 can be a control signal for a complementary switch (not shown) to bootstrapped switch 100. For example, bootstrapped switch 100 and a complementary non-bootstrapped switch can be driven by complementary control signals. Thus, the complementary switch can be driven by the control signal input to inverter 302, while bootstrapped switch 100 can be driven by a complement of the control signal that is output by inverter 302. A second terminal or current electrode of bootstrapped switch 100 is coupled, via switch 305. Switch 305 can be controlled by the output of delay circuit 200, connecting the output of bootstrapped switch 100 to digitizer 306 when the non-overlapping control signal is HIGH. A first terminal of capacitor 304 can be coupled between the output of bootstrapped switch 100 and switch 305 to sample the input voltage and hold the charge while digitizer 306 converts the voltage on capacitor 304 to a digital code When switch 305 is closed, digitizer 306 receives the output from bootstrapped switch 100 and outputs a digital code corresponding to the input analog voltage.

Bootstrapped switch 100 in ADC 300 helps ensure that the resistance of bootstrapped switch 100 is constant irrespective of the value of voltage VIN.

Figure 4:
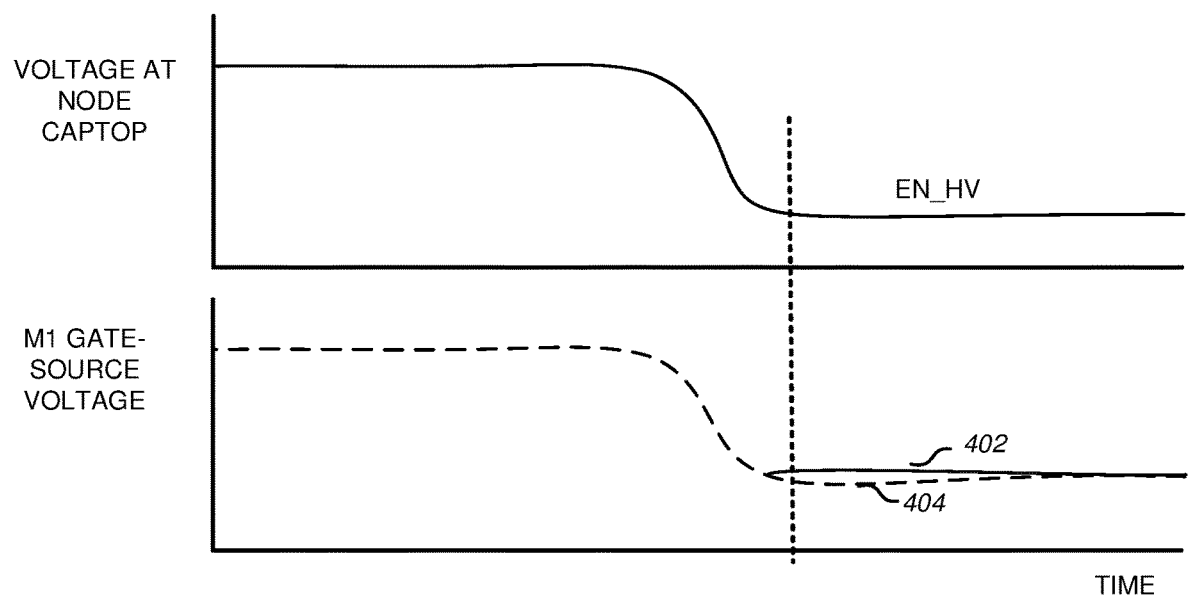
FIG. 4 illustrates an example of a time history curve showing improved ability to maintain a constant gate-source voltage in the bootstrapped switch of FIG. 1 during voltage swings.

Referring to FIGS. 1 and 4, FIG. 4 illustrates an example of time history curve 402, 404 showing improved ability to prevent a forward biasing of bulk-drain p-n junction in transistor M7 of bootstrapped switch 100 of FIG. 1. When voltage EN_HV goes to zero as bootstrapped switch 100 transitions OFF, the gate-source voltage of transistor M1 shown by curve 402 remains essentially constant at the time voltage EN_HV goes to zero due to the bulk of transistor M7 being connected to supply voltage VDDA instead of being forward biased. In contrast, in a bootstrapped switch 100 without transistors M11 and M12, time history curve 404 shows that the bulk-drain junction of transistor M7 can become forward biased by a large voltage. The transient excursion below the desired value can affect the reliability of a bootstrapped switch that can be avoided by using transistors M11 and M12 as shown in FIG. 1.

By now it should be appreciated that in some embodiments, there has been provided an integrated circuit that can include a bootstrapped switch (100), comprising: a capacitor (102), a first transistor (M1) having a first current electrode coupled to a first voltage terminal (VIN), and a gate electrode coupled to a first circuit node, a second transistor (M7) having a first current electrode coupled to a second voltage supply terminal (VDDA), a second current electrode coupled to a top terminal of the capacitor, and a control electrode coupled to the first circuit node, a third transistor (M12) having a first current electrode coupled to the first voltage supply terminal, a control electrode coupled to the first circuit node, and a second current electrode coupled to a body terminal of the second transistor (M7), and a fourth transistor (M11) having a first current electrode coupled to the body terminal of the second transistor (M7), and a second current electrode coupled to the top terminal of the capacitor.

In another aspect, the bootstrapped switch can further comprise a delay chain (202) having a first input to receive an input bit (SWITCH_CTRL), wherein a voltage (EN_HV) at the first circuit node is controlled based on the input bit, the delay chain configured to provide a first delayed output (INB) corresponding to a delayed version of the input bit, and a second delayed output (INBB) corresponding to a delayed version of an inverse of the first delayed output.

In another aspect, when the input bit (SWITCH_CTRL) has a first value (e.g. 1), the first transistor is turned off, and when the input has a second value (e.g. 0), opposite the first value, the first transistor can be turned on.

In another aspect, the delay chain can comprise a plurality of series-connected inverters (206-220), wherein a first inverter (206) of the delay chain can have an input to receive the input bit (SWITCH_CTRL), a second inverter (208) of the delay chain can have an output to provide the first delayed output (INB), in which there is an even number of inverters between the input of the first inverter (SWITCH_CTRL) and the output of the second inverter (INB), a third inverter (216) of the delay chain can have an output to provide the second delayed output in which there is an odd number of inverters, greater than one, between the output of the second inverter (INB) and the output of the third inverter (INBB).

In another aspect, a fourth inverter of the delay chain (214) located between the second inverter and the third inverter, wherein there can be an even number of inverters between the input of the first inverter (SWITCH_CTRL) and an output (CAP_GND_CTRL) of the fourth inverter.

In another aspect, the bootstrapped switch can further include a fifth transistor (M6) having a first current electrode coupled to a bottom terminal of the capacitor, a control electrode coupled to the output of the fourth inverter (214), and a second control electrode coupled to a third voltage supply terminal (e.g. GND), wherein each of the first and second voltage supply terminals can supply a greater voltage than the third voltage supply terminal.

In another aspect, the bootstrapped switch can further include a sixth transistor (M2) having a first current electrode coupled to the bottom terminal of the capacitor, a second current electrode coupled to the first current electrode of the first transistor, and a control electrode coupled to the first circuit node.

In another aspect, the boot strap switch can further comprise an inverter (M4/M5) having an input coupled to receive the second delayed output from the delay chain (INBB) and an output (VY) coupled to a control electrode of the fourth transistor (M11).

In another aspect, the bootstrapped switch further can comprise a fifth transistor (M8) having a first current electrode coupled to the top terminal of the capacitor, a second current electrode coupled to the first circuit node, and a control electrode coupled to the output of the inverter.

In another aspect, the bootstrapped switch can further comprise a sixth transistor (M9) having a first current electrode coupled to the first circuit node, a control electrode coupled to the second voltage supply terminal (VDDA), and a second current electrode; and a seventh transistor (M10) having a first current electrode coupled to the second current electrode of the sixth transistor, a control electrode coupled to receive the first delayed output of the delay chain (INB), and a second current electrode coupled to a third voltage supply terminal (GND), wherein each of the first and second voltage supply terminals supply a greater voltage than the third voltage supply terminal In other selected embodiments, an integrated circuit can comprise a bootstrapped switch configured to receive an input bit (SWITCH_CTRL), the bootstrapped switch can comprise a capacitor (102), a first transistor (M1) having a first current electrode coupled to a first voltage terminal (VIN), and a gate electrode coupled to a first circuit node, a second transistor (M7) having a first current electrode coupled to a second voltage supply terminal (VDDA), a second current electrode coupled to a top terminal of the capacitor, and a control electrode coupled to the first circuit node, a third transistor (M12) having a first current electrode coupled to the first voltage supply terminal, a control electrode coupled to the first circuit node, and a second current electrode coupled to a body terminal of the second transistor (M7), a fourth transistor (M11) having a first current electrode coupled to the body terminal of the second transistor (M7), and a second current electrode coupled to the top terminal of the capacitor and an inverter (M4/M5) having an input coupled to receive an inverse of a delayed version of the input bit (INBB) and an output (VY) coupled to a control electrode of the fourth transistor (M11).

In another aspect, the integrated circuit can further comprise a fifth transistor (M8) having a first current electrode coupled to the top terminal of the capacitor, a second current electrode coupled to the first circuit node, and a control electrode coupled to the output of the inverter.

In another aspect, the integrated circuit can further comprise a sixth transistor (M6) having a first current electrode coupled to a bottom terminal of the capacitor, a control electrode coupled to receive a delayed version of the input bit (CAP_GND_CTRL), and a second control electrode coupled to a third voltage supply terminal (GND), wherein each of the first and second voltage supply terminals supply a greater supply voltage than the third voltage supply terminal.

In another aspect, the bootstrapped switch can further comprise a delay chain including a plurality of series-connected delay elements, the plurality of series-connected delay elements comprising a first delay element (206), a second delay element (214), and a third delay element (216), wherein the second delay element is between the first delay element and the third delay element. An input of the first delay element can be coupled to receive the input bit (SWITCH_CTRL), an output of the second delay element can be coupled to provide the delayed version of the input bit (CAP_GND_CTRL) to the control electrode of the sixth transistor, and an output of the third delay element (216) can be configured to provide the inverse of the delayed version of the input bit (INBB) to the input of the inverter (M4/M5).

In another aspect, the integrated circuit can further comprise an analog to digital converter (ADC), wherein a first current electrode of the first transistor can be coupled to receive an input analog voltage, and a second current electrode of the first transistor is coupled, via a switch, to a digitizer, wherein the digitizer is configured to output a digital code corresponding to the input analog voltage.

In another aspect, the integrated circuit can further comprise a logic gate (204) having a first input coupled to receive the input bit, a second input coupled to an output of a final delay element of the plurality of series-connected delay elements, and an output (non-overlapping ctrl signal) coupled to the control input of the switch.

In another aspect, the integrated circuit can further comprise a second capacitor having a first terminal coupled to the second current electrode of the first transistor, and a second terminal coupled to a second voltage supply terminal (e.g. gnd), wherein the first voltage supply terminal supplies a greater voltage than the second voltage supply terminal.

In another aspect, each delay element of the delay chain can comprise an inverter.

In still further embodiments, a bootstrapped switch can comprise a delay chain having a plurality of series-connected inverters, including a first inverter (206), a second inverter (214), and a third inverter (216), wherein the second inverter is located in the delay chain between the first and third inverters, and the first inverter has an input coupled to receive an input bit (SWITCH_CTRL), a capacitor (102), a first transistor (M1) having a first current electrode coupled to a first voltage supply terminal (VDDA/VIN), and a gate electrode coupled to a first circuit node, a second transistor (M7) having a first current electrode coupled to a second voltage supply terminal (VDDA), a second current electrode coupled to a top terminal of the capacitor, and a control electrode coupled to the first circuit node, a third transistor (M12) having a first current electrode coupled to the first voltage supply terminal, a control electrode coupled to the first circuit node, and a second current electrode coupled to a body terminal of the second transistor (M7), a fourth transistor (M11) having a first current electrode coupled to the body terminal of the second transistor (M7) and a second current electrode coupled to the top terminal of the capacitor, a fourth inverter (M4/M5) having an input coupled to an output of the third inverter (INBB) and an output (VY) coupled to a control electrode of the fourth transistor (M11), and a fifth transistor (M6) having a first current electrode coupled to a bottom terminal of the capacitor, a control electrode coupled to an output of the second inverter (CAP_GND_CTRL), and a second control electrode coupled to a third voltage supply terminal (GND). Each of the first and second voltage supply terminals can supply a greater supply voltage than the third voltage supply terminal.

In another aspect, the bootstrapped switch can further comprise a sixth transistor (M8) having a first current electrode coupled to the top terminal of the capacitor, a second current electrode coupled to the first circuit node, and a control electrode coupled to the output of the fourth inverter.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetoresistive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name, a lower case "b" following the signal name, or an asterisk (*) following the name. In the case of a negative logic signal, the signal is active LOW where the logically true state corresponds to a logic level zero. In the case of a positive logic signal, the signal is active HIGH where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a bootstrapped switch, comprising:
      a capacitor;
      a first transistor having a first current electrode coupled to a first voltage terminal, and a gate electrode coupled to a first circuit node;
      a second transistor having a first current electrode coupled to a second voltage supply terminal, a second current electrode coupled to a top terminal of the capacitor, and a control electrode coupled to the first circuit node;
      a third transistor having a first current electrode coupled to the first voltage supply terminal, a control electrode coupled to the first circuit node, and a second current electrode coupled to a body terminal of the second transistor; and
      a fourth transistor having a first current electrode coupled to the body terminal of the second transistor, and a second current electrode coupled to the top terminal of the capacitor.

2. The integrated circuit of claim 1, wherein the bootstrapped switch further comprises:
   a delay chain having a first input to receive an input bit, wherein a voltage at the first circuit node is controlled based on the input bit, the delay chain configured to provide a first delayed output corresponding to a delayed version of the input bit, and a second delayed output corresponding to a delayed version of an inverse of the first delayed output.

3. The integrated circuit of claim 2, wherein when the input bit has a first value, the first transistor is turned off, and when the input has a second value, opposite the first value, the first transistor is turned on.

4. The integrated circuit of claim 2, wherein the delay chain comprises a plurality of series-connected inverters, wherein:
   a first inverter of the delay chain has an input to receive the input bit,
   a second inverter of the delay chain has an output to provide the first delayed output, in which there is an even number of inverters between the input of the first inverter and the output of the second inverter,
   a third inverter of the delay chain has an output to provide the second delayed output in which there is an odd number of inverters, greater than one, between the output of the second inverter and the output of the third inverter.

5. The integrated circuit of claim 4, wherein a fourth inverter of the delay chain is located between the second inverter and the third inverter, wherein there is an even number of inverters between the input of the first inverter and an output of the fourth inverter.

6. The integrated circuit of claim 5, wherein the bootstrapped switch further includes:
   a fifth transistor having a first current electrode coupled to a bottom terminal of the capacitor, a control electrode coupled to the output of the fourth inverter, and a second control electrode coupled to a third voltage supply terminal, wherein each of the first and second voltage supply terminals supply a greater voltage than the third voltage supply terminal.

7. The integrated circuit of claim 6, wherein the bootstrapped switch further includes:
   a sixth transistor having a first current electrode coupled to the bottom terminal of the capacitor, a second current electrode coupled to the first current electrode of the first transistor, and a control electrode coupled to the first circuit node.

8. The integrated circuit of claim 2, wherein the bootstrapped switch further comprises:
an inverter having an input coupled to receive the second delayed output from the delay chain and an output coupled to a control electrode of the fourth transistor.

9. The integrated circuit of claim 8, wherein the bootstrapped switch further comprises:
a fifth transistor having a first current electrode coupled to the top terminal of the capacitor, a second current electrode coupled to the first circuit node, and a control electrode coupled to the output of the inverter.

10. The integrated circuit of claim 9, wherein the bootstrapped switch further comprises:
a sixth transistor having a first current electrode coupled to the first circuit node, a control electrode coupled to the second voltage supply terminal, and a second current electrode; and
a seventh transistor having a first current electrode coupled to the second current electrode of the sixth transistor, a control electrode coupled to receive the first delayed output of the delay chain, and a second current electrode coupled to a third voltage supply terminal, wherein each of the first and second voltage supply terminals supply a greater voltage than the third voltage supply terminal.

11. An integrated circuit, comprising:
a bootstrapped switch configured to receive an input bit, the bootstrapped switch comprising:
a capacitor;
a first transistor having a first current electrode coupled to a first voltage terminal, and a gate electrode coupled to a first circuit node;
a second transistor having a first current electrode coupled to a second voltage supply terminal, a second current electrode coupled to a top terminal of the capacitor, and a control electrode coupled to the first circuit node;
a third transistor having a first current electrode coupled to the first voltage supply terminal, a control electrode coupled to the first circuit node, and a second current electrode coupled to a body terminal of the second transistor;
a fourth transistor having a first current electrode coupled to the body terminal of the second transistor, and a second current electrode coupled to the top terminal of the capacitor;
an inverter having an input coupled to receive an inverse of a delayed version of the input bit and an output coupled to a control electrode of the fourth transistor.

12. The integrated circuit of claim 11, further comprising:
a fifth transistor having a first current electrode coupled to the top terminal of the capacitor, a second current electrode coupled to the first circuit node, and a control electrode coupled to the output of the inverter.

13. The integrated circuit of claim 12, further comprising:
a sixth transistor having a first current electrode coupled to a bottom terminal of the capacitor, a control electrode coupled to receive a delayed version of the input bit, and a second control electrode coupled to a third voltage supply terminal, wherein each of the first and second voltage supply terminals supply a greater supply voltage than the third voltage supply terminal.

14. The integrated circuit of claim 13, wherein the bootstrapped switch further comprises:
a delay chain including a plurality of series-connected delay elements, the plurality of series-connected delay elements comprising a first delay element, a second delay element, and a third delay element, wherein the second delay element is between the first delay element and the third delay element, wherein:
an input of the first delay element is coupled to receive the input bit,
an output of the second delay element is coupled to provide the delayed version of the input bit to the control electrode of the sixth transistor, and
an output of the third delay element is configured to provide the inverse of the delayed version of the input bit to the input of the inverter.

15. The integrated circuit of claim 14, the integrated circuit further comprises:
an analog to digital converter (ADC), wherein a first current electrode of the first transistor is coupled to receive an input analog voltage, and a second current electrode of the first transistor is coupled, via a switch, to a digitizer, wherein the digitizer is configured to output a digital code corresponding to the input analog voltage.

16. The integrated circuit of claim 15, further comprising:
a logic gate having a first input coupled to receive the input bit, a second input coupled to an output of a final delay element of the plurality of series-connected delay elements, and an output coupled to the control input of the switch.

17. The integrated circuit of claim 15, further comprising a second capacitor having a first terminal coupled to the second current electrode of the first transistor, and a second terminal coupled to a second voltage supply terminal, wherein the first voltage supply terminal supplies a greater voltage than the second voltage supply terminal.

18. The integrated circuit of claim 14, wherein each delay element of the delay chain comprises an inverter.

19. A bootstrapped switch comprising:
a delay chain having a plurality of series-connected inverters, including a first inverter, a second inverter, and a third inverter, wherein the second inverter is located in the delay chain between the first and third inverters, and the first inverter has an input coupled to receive an input bit;
a capacitor;
a first transistor having a first current electrode coupled to a first voltage terminal, and a gate electrode coupled to a first circuit node;
a second transistor having a first current electrode coupled to a second voltage supply terminal, a second current electrode coupled to a top terminal of the capacitor, and a control electrode coupled to the first circuit node;
a third transistor having a first current electrode coupled to the first voltage supply terminal, a control electrode coupled to the first circuit node, and a second current electrode coupled to a body terminal of the second transistor;
a fourth transistor having a first current electrode coupled to the body terminal of the second transistor and a second current electrode coupled to the top terminal of the capacitor;
a fourth inverter having an input coupled to an output of the third inverter and an output coupled to a control electrode of the fourth transistor; and a fifth transistor having a first current electrode coupled to a bottom terminal of the capacitor, a control electrode coupled to an output of the second inverter, and a second control electrode coupled to a third voltage supply terminal, wherein each of the first and second voltage supply terminals supply a greater supply voltage than the third voltage supply terminal.

20. The bootstrapped switch of claim 19, further comprising;
a sixth transistor having a first current electrode coupled to the top terminal of the capacitor, a second current electrode coupled to the first circuit node, and a control electrode coupled to the output of the fourth inverter.

\* \* \* \* \*